United States Patent
Kim et al.

(10) Patent No.: US 12,019,116 B2
(45) Date of Patent: Jun. 25, 2024

(54) APPARATUS FOR ALIGNING DEVICE HAVING FINE PITCH AND METHOD THEREFOR

(71) Applicant: AMT CO., LTD., Asan-si (KR)

(72) Inventors: Du Chul Kim, Cheonan-si (KR); Wan Gu Lee, Cheonan-si (KR)

(73) Assignee: AMT CO., LTD., Asan-si (KR)

( * ) Notice: Subject to any disclaimer, the term of this patent is extended or adjusted under 35 U.S.C. 154(b) by 173 days.

(21) Appl. No.: 17/783,923

(22) PCT Filed: Nov. 5, 2020

(86) PCT No.: PCT/KR2020/012674
§ 371 (c)(1),
(2) Date: Jun. 9, 2022

(87) PCT Pub. No.: WO2021/182699
PCT Pub. Date: Sep. 16, 2021

(65) Prior Publication Data
US 2023/0051231 A1    Feb. 16, 2023

(30) Foreign Application Priority Data

Mar. 9, 2020   (KR) .................. 10-2020-0029083

(51) Int. Cl.
*G01R 31/28*   (2006.01)

(52) U.S. Cl.
CPC ..... *G01R 31/2891* (2013.01); *G01R 31/2887* (2013.01); *G01R 31/2893* (2013.01)

(58) Field of Classification Search
CPC ............ G01R 31/2891; G01R 31/2887; G01R 31/2893; G01R 31/2865; G01R 31/2875; G01R 31/2867; G01R 31/2877
See application file for complete search history.

(56) References Cited

U.S. PATENT DOCUMENTS 5,481,202 A * 1/1996 Frye, Jr. ............. G01R 31/2886
                                                        324/754.03
6,051,067 A * 4/2000 Mou .................... H01L 21/6838
                                                        211/41.18
(Continued)

FOREIGN PATENT DOCUMENTS

JP         5511790 B2    6/2014
JP      2018-200314 A   12/2018
(Continued)

OTHER PUBLICATIONS

International Search Report for PCT/KR2020/012674 mailed Jan. 13, 2021 from Korean Intellectual Property Office.

*Primary Examiner* — Akm Zakaria
(74) *Attorney, Agent, or Firm* — Paratus Law Group, PLLC

(57) ABSTRACT

A method for aligning a device includes: loading devices sequentially on an upper surface of a base plate having vacuum holes; suctioning the loaded device with vacuum pressure that allows minute movement of the loaded device, as the vacuum pressure is applied while the device is loaded on the base plate; moving an alignment vision assembly positioned above the base plate to the upper portion of the device to be aligned and then lowering the alignment vision assembly; checking a position of the device with a vision means through a through hole and an opening in a state, in which an alignment block surrounds the device, so as to inform a controller of the coordinates of the device; and aligning the device by finely moving the base plate in X-Y-θ directions according to the coordinates so that the device is guided to two surfaces of the opening.

9 Claims, 9 Drawing Sheets

(56) References Cited

U.S. PATENT DOCUMENTS

| | | | | |
|---|---|---|---|---|
| 10,157,760 B2* | 12/2018 | Kai | ................... | H01L 23/49833 |
| 2007/0141951 A1* | 6/2007 | Naoki | ............... | H01L 21/67259 |
| | | | | 451/5 |
| 2019/0353701 A1* | 11/2019 | Hamada | ............. | G01R 31/2886 |
| 2023/0131189 A1* | 4/2023 | Kiyokawa | ............ | G01R 1/0458 |
| | | | | 324/750.2 |
| 2023/0393188 A1* | 12/2023 | Cruzan | .............. | G01R 31/2893 |

FOREIGN PATENT DOCUMENTS

| | | |
|---|---|---|
| KR | 10-1464990 B1 | 11/2014 |
| KR | 10-1779172 B1 | 9/2017 |
| KR | 10-1804051 B1 | 12/2017 |
| KR | 10-2041182 B1 | 11/2019 |
| KR | 10-2045506 B1 | 11/2019 |

\* cited by examiner

APPARATUS FOR ALIGNING DEVICE HAVING FINE PITCH AND METHOD THEREFOR

CROSS-REFERENCE TO PRIOR APPLICATIONS

This application is a National Stage Patent application of PCT International Patent Application No. PCT/KR2020/012674 (filed on Nov. 5, 2020) under 35 U.S.C. § 371, which claims priority to Korean Patent Application No. 10-2020-0029083 (filed on Mar. 9, 2020), which are all hereby incorporated by reference in their entirety.

BACKGROUND

The present invention relates to an apparatus for aligning a device having a fine pitch and a method therefor, and more particularly, to an apparatus for aligning a device having a fine pitch, which may automatically and accurately align a plurality of devices in order to carry out performance tests in a handler after producing the devices such as thin small outline packages TSOPs or ball grid arrays BGAs with small-sized bumps and narrow pitches, and a method therefor.

In general, semiconductor devices such as ICs are inspected for defects by inspecting electrical characteristics during the manufacturing process thereof. The electrical characteristic test of a semiconductor device is performed by electrically connecting the ball terminals of a semiconductor device and the contact points of a test board including a printed circuit board PCB. Such a test is conducted for a set time so that good products are shipped and defective products are retested or discarded.

Conventionally, devices to be tested are individually transferred to a tester side so as to carry out the test of the electrical characteristics of each device in a state in which the device to be tested is inserted into a carrier.

That is, the electrical test of the device is performed through electrical contact between the ball terminals of the device loaded in the carrier and probe pins supported on a socket assembly. At this time, the ball terminals and the probe pins of a very small size are arranged in a narrow pitch, so very high precision alignment is required during testing. However, the ball terminals and the probe pins are aligned through the mutual alignment of the alignment holes of the carrier and the alignment pins of the socket guide.

PRIOR ART DOCUMENT (Patent Document 0001) Korean Reg. Patent Publication No. 10-1464990 (Registered on Nov. 19, 2014)
(Patent Document 0001) Korean Reg. Patent Publication No. 10-1779172 (Registered on Sep. 11, 2017)

SUMMARY

However, such a conventional alignment device has several problems as follows.

First, it is impossible to compact the equipment since a device positioned in a loading part is adsorbed and placed in a carrier by a loading picker, the carrier containing the device is transferred to a test side in turn and then the test is carried out for a set time, and the carrier with the device for which the test has been completed is transferred to an unloading part, so that an unloading picker unloads the device after sorting the same as good or bad according to the test result.

Second, since it is necessary to repeat the work of connecting and disconnecting the carrier to and from the socket guide during the test, the margins of the alignment pins and the alignment balls are increased through the repeated connection and disconnection, resulting in the mismatching or offset of the ball terminals and the probe pins.

Third, when conducting a conductivity test on thousands of devices, if the expensive device is damaged due to a collision between the device and the probe pins or the ball terminals of such a damaged device remain in the equipment, replacement or repair work has to be performed while the conductivity test is interrupted, reducing the operation ratio of expensive equipment.

The present invention has been derived to solve such problems in the prior art and has an objective to automatically align the position of a device to be tested after loading the device on the upper surface of a base plate to which vacuum pressure is applied, wherein a vision means recognizes the coordinates of the loaded device and informs a control unit of the recognized coordinates of the loaded device so that an alignment block moves the loaded device in X-, Y- and θ-axis directions while surrounding the device.

Another objective of the present invention is to enable electrical testing of a plurality of devices by moving a base plate to a tester side in a state, in which the positions of the plurality of devices are aligned and the plurality of devices are adsorbed to the base plate by vacuum pressure, and then connecting the ball terminals of the plurality of devices adsorbed to the base plate to the terminals of a tester at the same time.

In order to achieve the objectives, according to one aspect of the present invention, there is provided an apparatus for aligning a device having a fine pitch, comprising: a base having a vertical pillar, a Y-axis plate installed on the upper surface of the base so as to be move by one pitch in the Y-axis direction, a base plate installed on the upper surface of the Y-axis plate and having vacuum holes respectively formed at seating points of devices so that as vacuum pressure is applied while a device is loaded, the base plate suctions the loaded device with the vacuum pressure that allows minute movement of the loaded device, a base plate position adjusting means installed on the upper surface of the Y-axis plate so as to finely move the base plate in X-Y-θ directions according to the position of the device loaded on the base plate, an X-axis plate installed on the vertical pillar of the base so as to horizontally move by one pitch in the X-axis direction, a Z-axis plate installed on the X-axis plate so as to ascend or descend in the Z-axis direction, a vision block installed on the Z-axis plate and having a through hole, an alignment block installed under the vision block and having an opening formed to receive the device suctioned to the base plate, and a vision means installed on the upper part of the Z-axis plate and checking the position of the device suctioned to the base plate through the through hole of the vision block and the opening so as to inform a control unit of the coordinates of the device, wherein in a state, in which the alignment block descends according to the coordinates of the device suctioned to the base plate and surrounds the device, the alignment block aligns the device by finely moving the base plate in the X-Y-θ directions by the base plate position adjusting means.

According to another aspect of the present invention, there is provided a method for aligning a device having a fine pitch, comprising the step of loading devices sequentially on the upper surface of a base plate having a plurality of vacuum holes, the step of suctioning the loaded device with vacuum pressure that allows minute movement, as the vacuum pressure is applied while the device is loaded on the base plate, the step of moving an alignment vision assembly positioned above the base plate to the upper portion of the device to be aligned, the step of lowering the alignment vision assembly so as to allow the alignment block to surround the device and checking the position of the device with a vision means through a through hole and an opening so as to inform a control unit of the coordinates of the device, and the step of aligning the device by finely moving the base plate in the X-Y-θ directions according to the coordinates of the device so that the device is guided to two surfaces of the opening, wherein each time a device is loaded on the upper surface of the base plate, alignment of the device is performed while moving the base plate by one pitch in the X- and Y-axis directions.

The present invention has the following advantages over the prior art.

First, it is possible to make the equipment compact, since after devices are sequentially loaded on the base plate, the vision means recognizes the coordinates of the loaded device and informs the control unit of the recognized coordinates of the loaded device in the state in which the loaded device is suctioned with the vacuum pressure that allows the minute movement of the loaded device, and then the device is aligned by the base plate position adjusting means in the state in which the device is surrounded by the alignment block.

Second, testing is performed by electrically connecting a plurality of devices to a tester at the same time without using any separate carrier so that mismatching or offset between the ball terminals of the devices and the probe pins is prevented in advance and the test efficiency of the expensive equipment is maximized.

Third, the alignment precision is maximized owing to the excellent positioning performance of the base plate position adjusting means and frictional force reduction.

DETAILED DESCRIPTION

Figure 1:
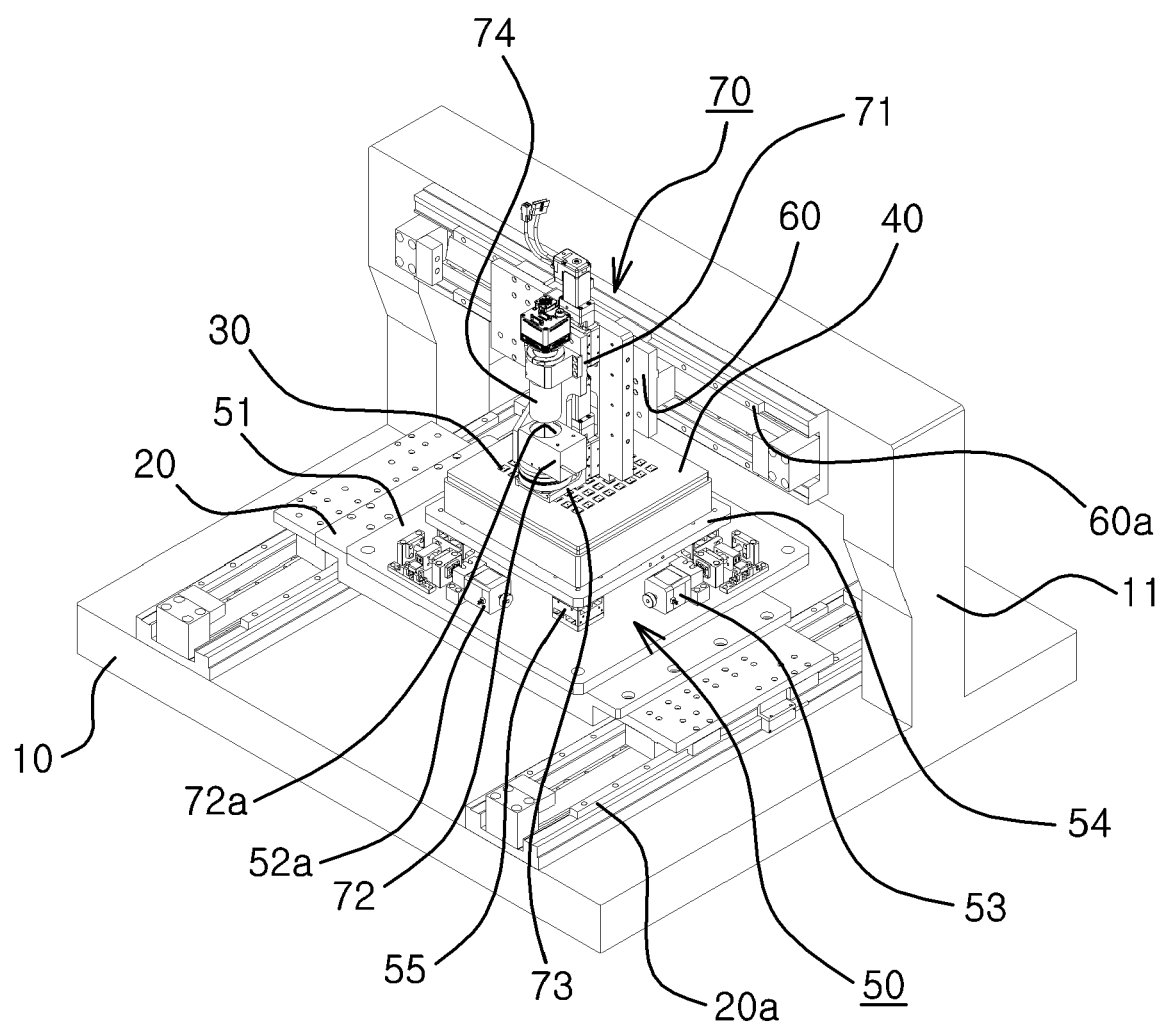
FIG. 1 is a perspective view showing the configuration of the present invention.

Hereinafter, with reference to the accompanying drawings, embodiments of the present invention will be described in detail such that those of ordinary skill in the art can easily implement them. The present invention may be implemented in several different forms and is not limited to the embodiments described herein. It should be noted that the drawings are schematic and not drawn to scale. Relative dimensions and proportions of parts in the drawings are shown exaggerated or reduced in size for clarity and convenience in the drawings and any dimensions are illustrative only and not limiting. In addition, the same reference numerals are used to denote like features to the same structure, element, or part appearing in two or more drawings.

Figure 2:
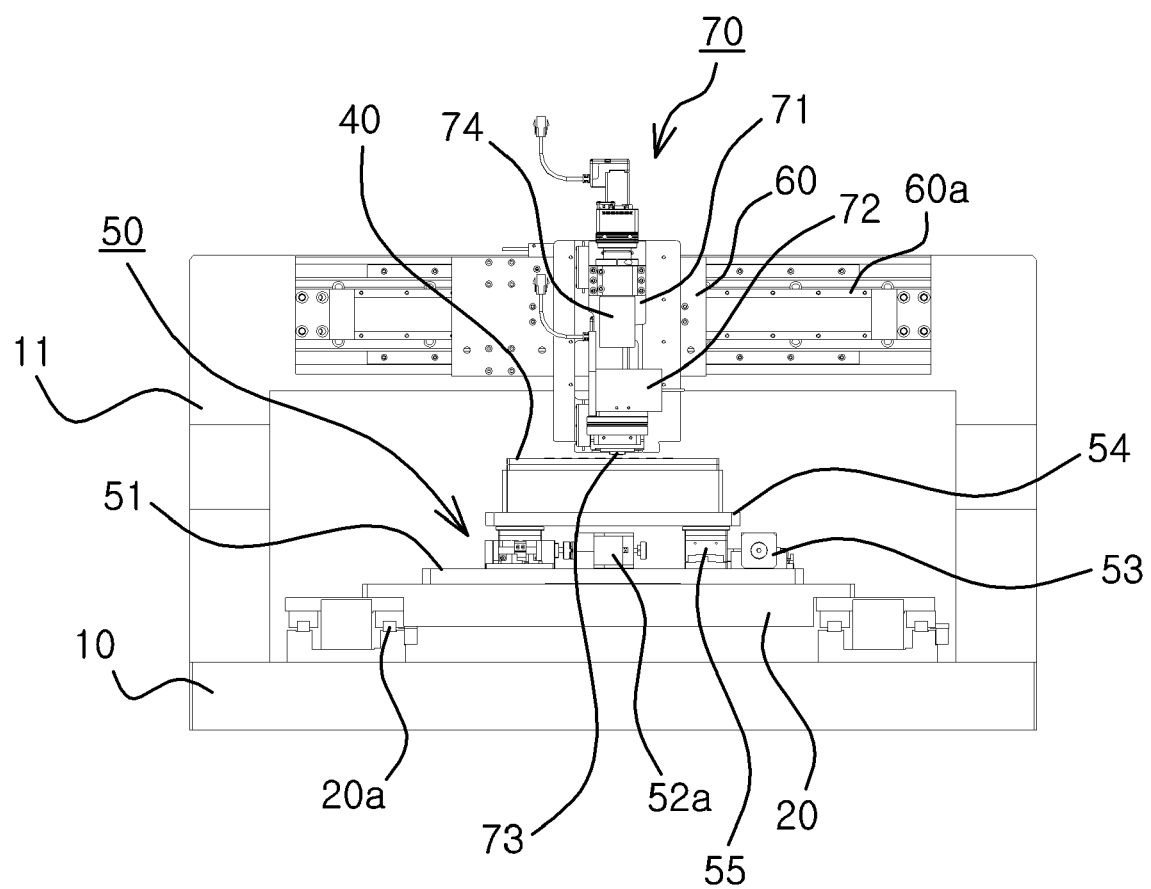
FIG. 2 and FIG. 3 are a front view and a side view of FIG. 1, respectively.
Figure 3:
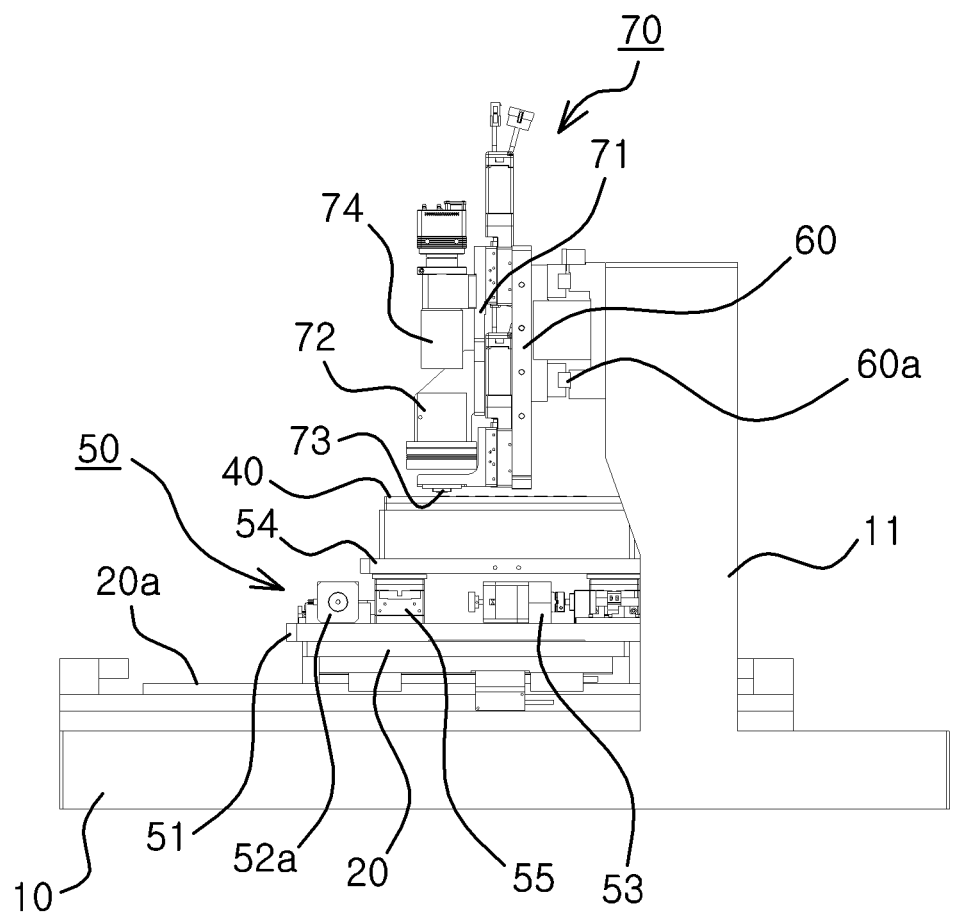
Figure 4:
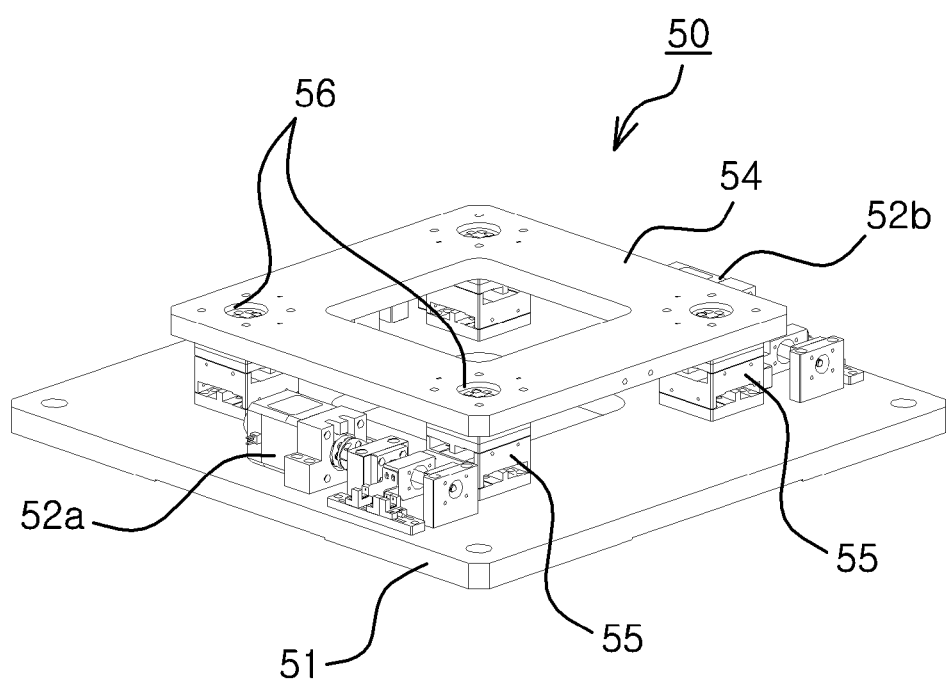
FIG. 4 is a perspective view showing an embodiment of a base plate position adjusting means according to the present invention.

FIG. 1 is a perspective view showing the configuration of the present invention, and FIG. 2 and FIG. 3 are a front view and a side view of FIG. 1, respectively. Referring to FIG. 1 to FIG. 3, according to the present invention, a Y-axis plate 20 is installed on the upper surface of a base 10 having a vertical column 11 so as to move by one pitch in the Y-axis direction (interval between devices loaded on the base plate), and a base plate 40 is installed on the upper surface of the Y-axis plate 20, wherein the base plate 40 has vacuum holes respectively formed at the seating points of devices 30 so as to suction the devices 30 as vacuum pressure (about 5-50 mmHg) is applied in a state, in which the devices 30 are loaded.

In one embodiment of the present invention, although the base plate 40 is shown in a square shape, it can be applied in various shapes, such as a rectangle or a circle, as necessary.

A heater and a cooling pipe (not shown) are installed in the base plate 40 so that the base plate 40 is maintained at room temperature, or heated to about 50 to 170° C., or cooled to about 0 to −55° C. according to test conditions for the devices 30, before loading the devices 30 on the upper surface of the base plate 40.

Even if the base plate 40 is formed of a material having a minimum coefficient of expansion (such as ceramics or the like), assuming that one side of the base plate 40 is 300 mm, the base plate 40 expands or contracts within the range of about 0.3 mm by heating or cooling. Therefore, before loading the devices 30 on the upper surface of the base plate 40, the temperature of the base plate 40 is adjusted according to test conditions so as to minimize errors due to the expansion or contraction of the base plate 40.

A base plate position adjusting means 50 is provided on the upper surface of the Y-axis plate 20 so as to finely move the base plate 40 in the X-Y-θ directions according to the position of the device 30 loaded on the base plate 40.

Figure 5A:
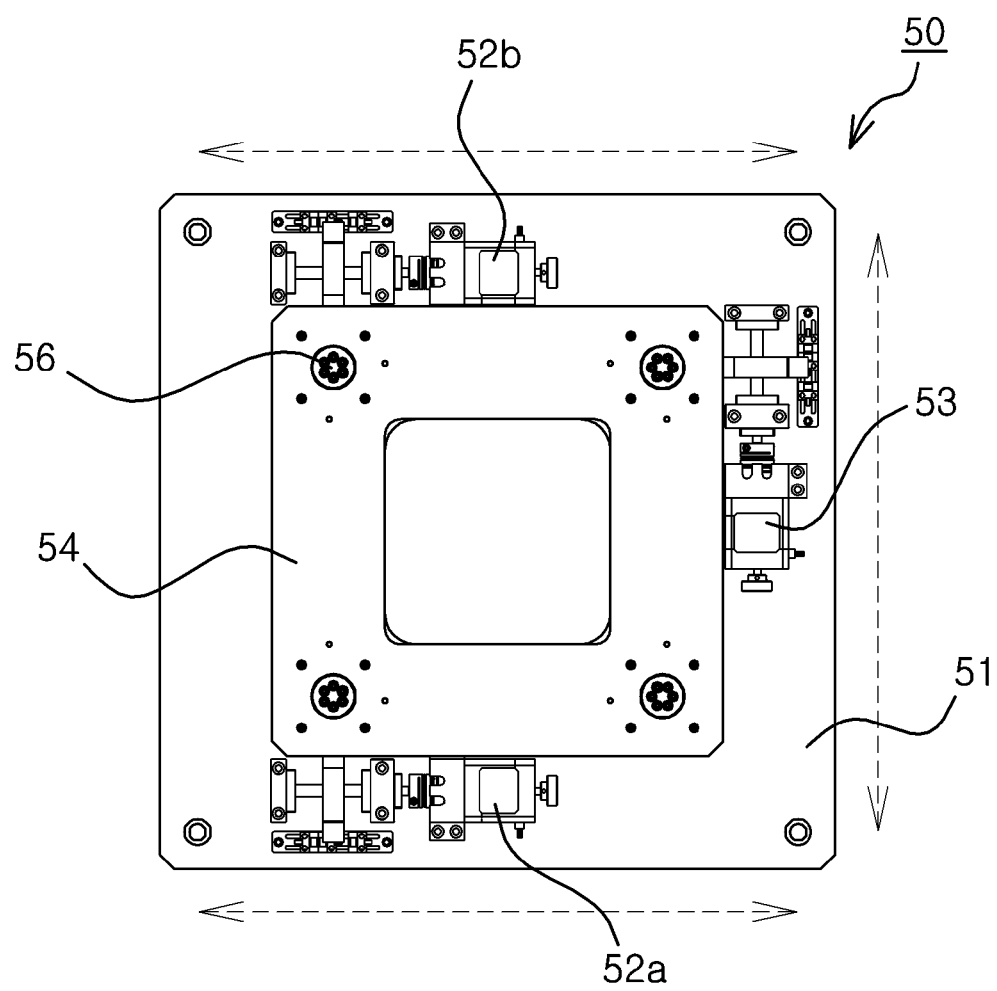
FIG. 5a and FIG. 5b are plane views of FIG. 4, respectively.
Figure 5B:
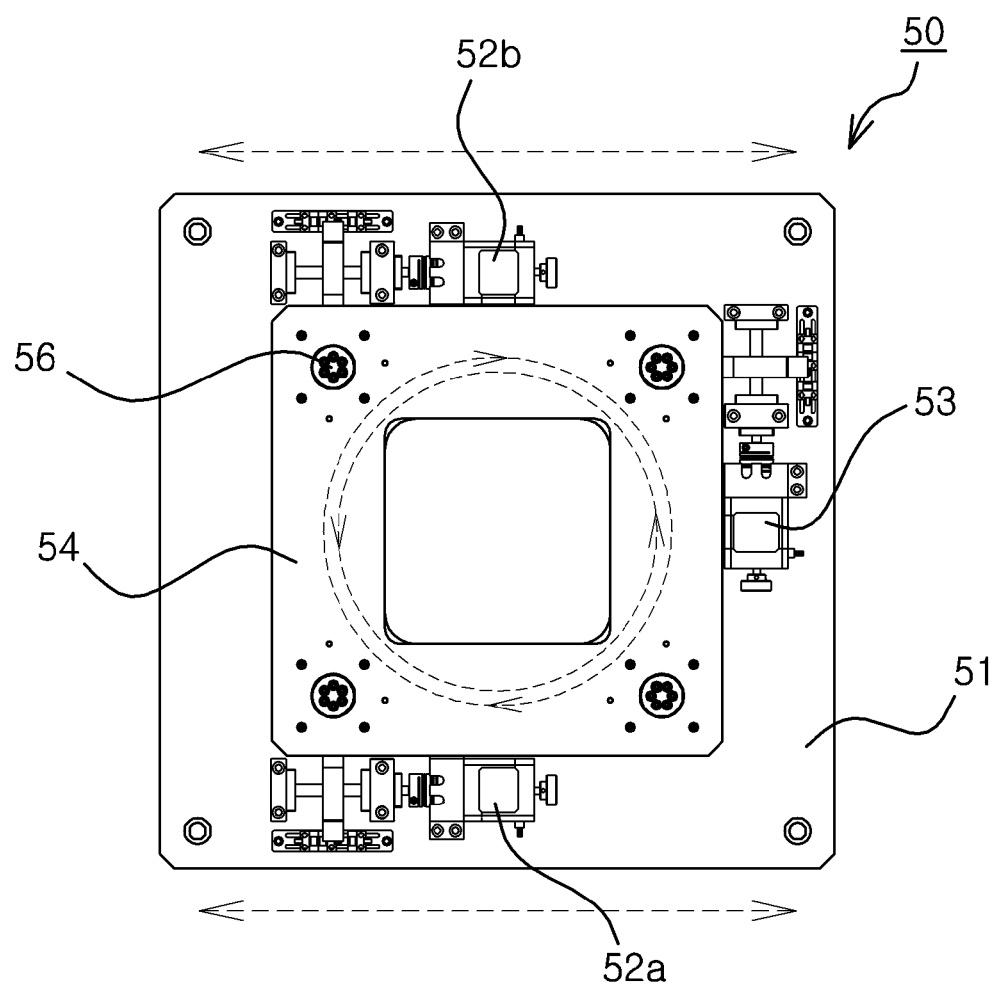

According to an embodiment of the present invention, as shown in FIGS. 5a and 5b, the base plate position adjusting means 50 includes an installation plate 51 fixed to the Y-axis plate 20, one pair of X-axis motors 52a, 52b installed opposite to the installation plate 51, a Y-axis motor 53 installed on the installation plate 51 so as to be orthogonal to the X-axis motors, a moving plate 54 installed so as to move finely in the X-Y-θ directions by the X-axis motors 52a, 52b and the Y-axis motor 53, four cross rollers 55 installed between the installation plate 51 and the moving plate 54 so as to allow the moving plate 54 to move in the X- and Y-axis directions, and a shaft 56 for rotatably coupling the moving plate 54 to the respective cross rollers 55.

The cross roller 55 includes a multi-stage plate having X- and Y-axis LM guides (not shown).

The base plate position adjusting means 50 shown as an embodiment of the present invention is a known ready-made product produced by MISUMI (model name: AA-300-35).

It could be understood that the base plate position adjusting means 50 can be modified and applied in various forms by those of ordinary skill in the art.

An X-axis plate 60 is installed on the vertical column 11 of the base 10 and horizontally moves by one pitch in the X-axis direction, wherein the X-axis plate 60 is provided with an alignment vision assembly 70 for reading the coordinates of the device 30 loaded on the base plate 40 and at the same time informing a control unit (not shown) of the coordinates so as to align the device 30.

The alignment vision assembly 70 includes a Z-axis plate 71 installed on the X-axis plate 60 so as to ascend or descend along the Z-axis, a vision block 72 provided on the Z-axis plate 71 and having a through hole 72a formed therein, and an alignment block 73 installed below the vision block 72 so as to surround the device 30 suctioned to the base plate 40.

Figure 6A:
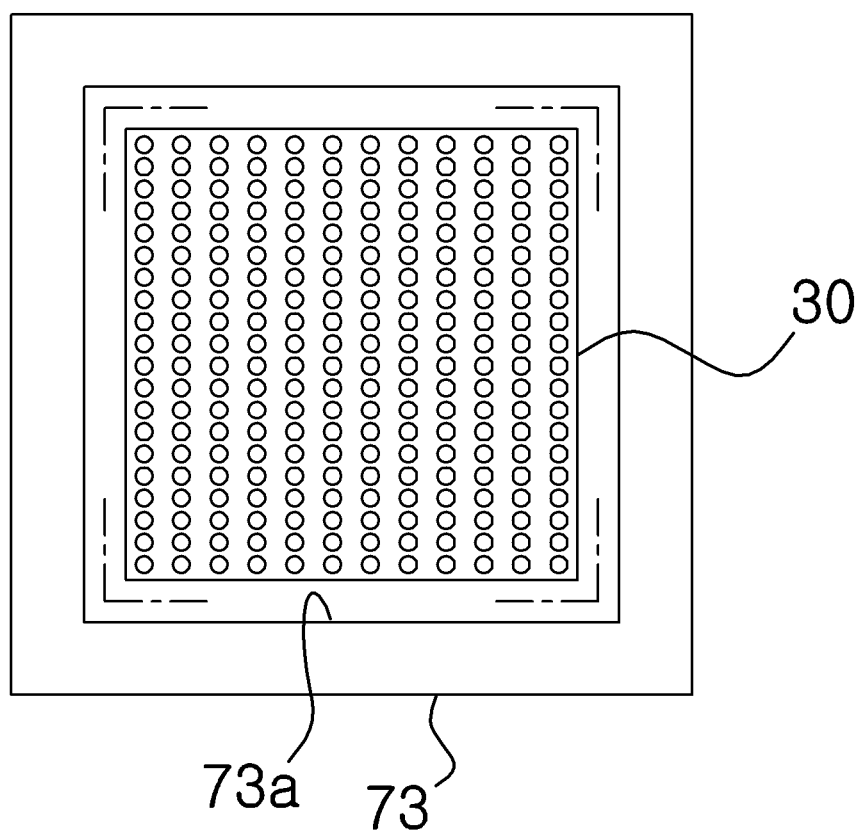
FIG. 6a is a plane view showing a state in which an alignment block according to the present invention surrounds a device.

Herein, an opening 73a is formed to be larger than the device 30 in the alignment block 73, as shown in FIG. 6a, so that when the alignment block 73 descends to the bottom dead center thereof, the device 30 is maintained received in the opening 73a of the alignment block 73.

The Y-axis plate 20 and the X-axis plate 71 are respectively guided by LM guides 20a, 60a so as to move rectilinearly so that it is possible to reduce frictional force when the Y-axis plate 20 and the X-axis plate 60 move, thereby maximizing alignment precision.

In addition, a vision means 74 is installed on the upper portion of the Z-axis plate 71 so as to check the position of the device 30, which is suctioned to the base plate 40, through the through hole 72a of the vision block 72 and inform the control unit of the coordinates of the device 30. Therefore, as the vision means 74 informs the control unit of the coordinates of the device 30 suctioned to the base plate 40 through the through hole 72a and the opening 73a, the alignment block 73 finely moves the base plate 40 in the X-Y-θ directions by the base plate position adjusting means 50 while surrounding the device 30, thereby aligning the device 30.

The operation of the present invention will now be described as follows.

First, before loading the device 30 to be tested on the upper surface of the base plate 40, the base plate 40 is maintained at room temperature, or heated to about 50 to 170° C., or cooled to about 0 to −55° C., depending on the test conditions of the device 30.

In the state where the base plate 40 is maintained at a temperature suitable for the test conditions of the device 30 as described above, when one device 30 positioned on the loading part (not shown) is picked and placed in the vacuum hole of the base plate 40, the device 30 is suctioned by a vacuum device (not shown) installed in connection with the vacuum hole, wherein the device 30 is suctioned with vacuum pressure of about 5 to 50 mmHg that allows the minute movement of the loaded device 30 (S100, S200).

After the device 30 is loaded into any one vacuum hole formed in the base plate 40 and suctioned with the vacuum pressure that allows the minute movement of the loaded device, the X-axis plate 60 is transported along the LM guide 60a so that the alignment vision assembly 70 positioned above the base plate 40 is positioned directly above the device 30 to be aligned (S300).

In this state, when the Z-axis plate 71 of the alignment vision assembly 70 descends and the alignment block 73 surrounds the device 30 as shown in FIG. 6a, the vision means 74 checks the position of the device 30 through the through hole 72a formed in the vision block 72 and the opening 73a of the alignment block 73 and informs the control unit (not shown) of the coordinates of the device 30 (S400).

As described above, since the opening 73a is formed in the alignment block 73, the position of the device 30 suctioned to the base plate 40 can be recognized through the through hole 72a of the vision block 72 and the opening 73a so that the vision means 74 installed on the upper portion of the Z-axis plate 71 can recognize the position of the device 30 and inform the controller of the position of the device 30.

Figure 6B:
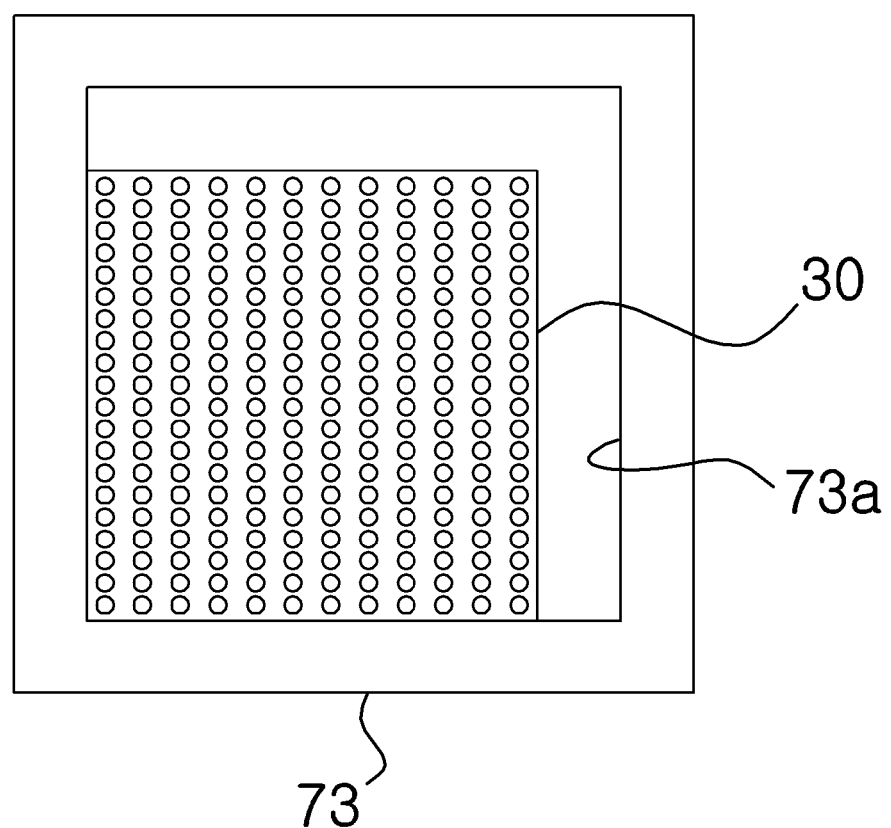
FIG. 6b is a view showing a state in which two surfaces of the device are connected to the inner peripheral surface of the alignment block of the present invention in order to correct the position of the device.
Figure 7:
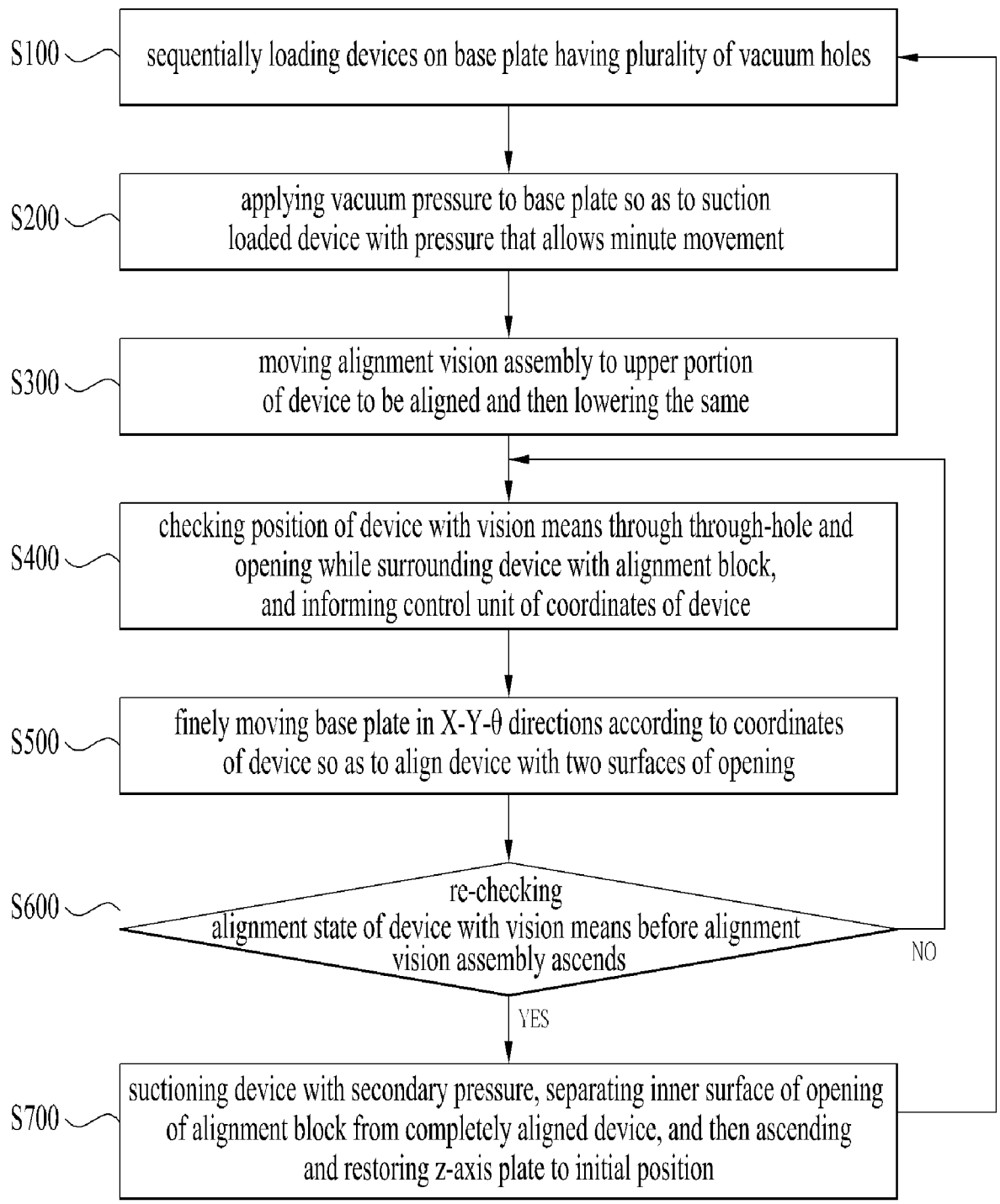
FIG. 7 is a flowchart for explaining an alignment method according to the present invention.

When the control unit is informed of the coordinates of the device 30 and the two X-axis motors 52a, 52b, which are the base plate position adjusting means 50, are driven in the same direction according to the coordinates of the device 30 suctioned to the vacuum hole, the moving plate 54 moves in the X-axis direction. In addition, when the Y-axis motor 53 is driven forward or backward, the moving plate 54 is moved in the Y-axis direction. If the two X-axis motors 52a, 52b are driven in the opposite directions to each other, the moving plate 54 moves finely in the θ direction. Therefore, the alignment block 73 pushes the device 30 so as to correct the position of the device 30, thereby aligning the device 30, as shown in FIG. 6b (S500).

Such an alignment can be implemented because the moving plate 54 is finely moved in the X- and Y-axis directions by the cross rollers 55 and also rotates finely in the θ direction by the shaft 56.

When aligning the device 30 by finely moving the device 30 in the X-Y-θ directions by the base plate position adjusting means 50 as described above, it is more preferable to correct the position of the device 30 in a state where the bottom surface of the alignment block 73 is spaced apart from the top surface of the base plate 40.

This is to prevent the generation of particles in advance, which may occur due to friction when aligning the position of the device 30 while the bottom surface of the alignment block 73 moves in contact with the top surface of the base plate 40.

After the alignment block 73 finely moves the device 30 in the X-Y-θ directions while surrounding the device 30 and thus the alignment of the device 30 suctioned to the base plate 40 is completed as described above, before the Z-axis plate 71 returns to the initial position thereof, the vision means 74 checks again the position of the aligned device 30 through the through hole 72a of the vision block 72 and the opening 73a of the alignment block 73 and informs the control unit of the position of the aligned device 30. If the alignment is accurately achieved, the inner surface of the opening 73a of the alignment block 73 is spaced apart from the device 30 and then the Z-axis plate 71 ascends and returns to the initial position thereof. If the alignment is not accurate, re-alignment operation for the device 30 is performed by the operation as described above (S600, S700).

It can be seen that the alignment operation for the device 30 as described above is performed in the same manner by moving the Y-axis plate 20 and the X-axis plate 60 by one pitch each time a new device 30 is loaded on the base plate 40.

After aligning the devices 30 by correcting the positions of the devices 30 suctioned to all the vacuum holes of the base plate 40 by the above operation, it is more preferable to suction the devices at vacuum pressure of about 50 to 100 mmHg so that the positions of the devices 30 are not changed due to vibration or the like when moving the devices 30 toward a tester (not shown).

After the devices 30 are suctioned to the base plate 40 with the vacuum pressure of about 50 to 100 mmHg in order to prevent the movement of the devices 30, the devices 30 are moved to a tester side and then the ball terminals of the devices 30 suctioned to the base plate 40 are connected to the terminals of the tester at the same time so that an electrical test can be performed.

Although embodiments of the present invention have been described with reference to the accompanying drawings, those of ordinary skill in the art to which the present invention belongs can understand that the present invention may be implemented in other specific forms without changing the technical spirit or essential features.

Therefore, the embodiments described hereinabove are to be understood as illustrative and not restrictive in all respects, the scope of the present invention described in the above detailed description is indicated by the following claims, and all changes or modifications derived from the meaning and scope of the claims and their equivalents should be construed as being included in the scope of the present invention.

[Explanation of Reference Signs]

10: base plate
11: vertical pillar
20: Y-axis plate
30: device
40: base plate adjusting means
50: base plate position
51: installation plate
52a, 52b: X-axis motor
53: Y-axis motor
54: moving plate
55: cross roller
56: shaft
60: X-axis plate
70: alignment vision assembly
71: Z-axis plate
72: vision block
72a: through hole
73: alignment block
73a: opening
74: vision means

The invention claimed is:

1. An apparatus for aligning a device having a fine pitch, comprising:
   a base having a vertical pillar;
   a Y-axis plate installed on the upper surface of the base so as to move by one pitch in the Y-axis direction;
   a base plate, which is installed on the upper surface of the Y-axis plate and has vacuum holes respectively formed at seating points of devices so that as vacuum pressure is applied while the devices are loaded, the base plate suctions the loaded devices with the vacuum pressure that allows minute movement of the loaded devices;
   a base plate position adjusting means installed on the upper surface of the Y-axis plate so as to finely move the base plate in X-Y-θ directions according to the position of the devices loaded on the base plate;
   an X-axis plate installed on the vertical pillar of the base so as to horizontally move by one pitch in the X-axis direction;
   a Z-axis plate installed on the X-axis plate so as to ascend or descend in the Z-axis direction;
   a vision block, which is installed on the Z-axis plate and has a through hole;
   an alignment block, which is installed under the vision block and has an opening formed to receive the device suctioned to the base plate; and
   a vision means, which is installed on the upper part of the Z-axis plate and checks the position of the device suctioned to the base plate through the through hole of the vision block and the opening so as to inform a control unit of the coordinates of the device,
   wherein in a state, in which the alignment block descends according to the coordinates of the device suctioned to the base plate and surrounds the device, the alignment block aligns the device by finely moving the base plate in the X-Y-θ directions by the base plate position adjusting means.

2. The apparatus for aligning a device having a fine pitch according to claim 1, wherein the base plate position adjusting means includes:
   an installation plate fixed to the Y-axis plate;
   one pair of X-axis motors installed opposite to the installation plate;
   a Y-axis motor installed on the installation plate so as to be orthogonal to the X-axis motors;
   a moving plate installed so as to move finely in the X-Y-θ directions by the X-axis motors and the Y-axis motor;
   four cross rollers installed between the installation plate and the moving plate so as to allow the moving plate to move in the X- and Y-axis directions; and
   a shaft for rotatably coupling the moving plate to the respective cross rollers.

3. The apparatus for aligning a device having a fine pitch according to claim 1, wherein the Y-axis plate and the X-axis plate are respectively guided by LM guides so as to carry out linear motion.

4. The apparatus for aligning a device having a fine pitch according to claim 1, wherein a heater and a cooling pipe are installed inside the base plate.

5. A method for aligning a device having a fine pitch, comprising:
   the step of loading a device sequentially on the upper surface of a base plate having a plurality of vacuum holes;
   the step of suctioning the loaded device with vacuum pressure that allows minute movement of the loaded device, as the vacuum pressure is applied while the device is loaded on the base plate;
   the step of moving an alignment vision assembly positioned above the base plate to the upper portion of the device to be aligned and then lowering the alignment vision assembly;
   the step of checking the position of the device with a vision means through a through hole and an opening in a state, in which an alignment block surrounds the device, so as to inform a control unit of the coordinates of the device; and
   the step of aligning the device by finely moving the base plate in the X-Y-θ directions according to the coordinates of the device so that the device is guided to two surfaces of the opening,
   wherein each time a device is loaded on the upper surface of the base plate, alignment of the device is performed while moving the base plate by one pitch in the X- and Y-axis directions.

6. The method for aligning a device having a fine pitch according to claim 5, wherein the alignment block corrects the position of the device in a state in which the device is suctioned at a pressure of 5 to 50 mmHg.

7. The method for aligning a device having a fine pitch according to claim 5, wherein further comprising the step of suctioning the device with secondary pressure so as to prevent the movement of the device, after the alignment of the device is completed.

8. The method for aligning a device having a fine pitch according to claim 7, wherein the secondary pressure is 50 to 100 mmHg.

9. The method for aligning a device having a fine pitch according to claim 5, wherein after the alignment block corrects the position of the device so that the alignment is finished, the inner surface of the opening is spaced apart from the device and then the alignment block ascends.

\* \* \* \* \*